United States Patent
Meissner et al.

(10) Patent No.: US 7,218,079 B2
(45) Date of Patent: May 15, 2007

(54) ELECTROCHEMICAL ENERGY STORE AND METHOD FOR DETERMINING THE WEAR TO AN ELECTROCHEMICAL ENERGY STORE

(75) Inventors: Eberhard Meissner, Wunstorf (DE); Helmut Laig-Hoerstebrock, Frankfurt (DE)

(73) Assignee: V8 Autobatterie GmbH, Hannover (DE)

( * ) Notice: Subject to any disclaimer, the term of this patent is extended or adjusted under 35 U.S.C. 154(b) by 504 days.

(21) Appl. No.: 10/407,585

(22) Filed: Apr. 4, 2003

(65) Prior Publication Data
US 2003/0215699 A1 Nov. 20, 2003

(30) Foreign Application Priority Data
Apr. 5, 2002 (DE) .............................. 102 15 071

(51) Int. Cl.
*B60Q 1/00* (2006.01)
*H02J 7/04* (2006.01)
(52) U.S. Cl. ..................................................... 320/149
(58) Field of Classification Search ................. 340/455
See application file for complete search history.

(56) References Cited

U.S. PATENT DOCUMENTS

| | | |
|---|---|---|
| 3,906,329 A | 9/1975 | Bader |
| 4,153,867 A | 5/1979 | Jungfer et al. |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |
| 4,665,370 A | 5/1987 | Holland |
| 4,719,427 A | 1/1988 | Morishita et al. |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |
| 4,943,777 A | 7/1990 | Nakamura et al. |
| 4,952,861 A | 8/1990 | Horn |
| 5,002,840 A | 3/1991 | Klebenow et al. |
| 5,032,825 A | 7/1991 | Kuznicki |

(Continued)

FOREIGN PATENT DOCUMENTS

DE 22 42 410 3/1973

(Continued)

OTHER PUBLICATIONS

Intelec '88—Tenth International communications Energy Conference, "A look at the Impedance of a Cell—S.L. DeBardelaben, New York Telephone Company," bearing a designation "Oct. 30-Nov. 2, 1988." (6 sheets).

(Continued)

*Primary Examiner*—Karl Easthom
*Assistant Examiner*—Alexis Boateng
(74) *Attorney, Agent, or Firm*—Foley & Lardner LLP

(57) ABSTRACT

A method for determining the wear to an electrochemical energy store and an electrochemical energy store allows for continuously determining the amounts of charge ($q_L$) converted during charging cycles of the energy store and calculating a wear variable ($Q_v$) which characterizes the wear as a function of the determined converted amount of charge ($q_L$).

13 Claims, 1 Drawing Sheet

U.S. PATENT DOCUMENTS

| | | | |
|---|---|---|---|
| 5,055,656 | A | 10/1991 | Farah et al. |
| 5,079,716 | A | 1/1992 | Lenhardt et al. |
| 5,130,699 | A | 7/1992 | Reher et al. |
| 5,159,272 | A | 10/1992 | Rao et al. |
| 5,162,164 | A | 11/1992 | Dougherty et al. |
| 5,204,610 | A | 4/1993 | Pierson et al. |
| 5,223,351 | A | 6/1993 | Wruck |
| 5,280,231 | A | 1/1994 | Kato et al. |
| 5,281,919 | A | 1/1994 | Palanisamy |
| 5,316,868 | A | 5/1994 | Dougherty et al. |
| 5,321,627 | A | 6/1994 | Reher |
| 5,352,968 | A | 10/1994 | Reni et al. |
| 5,381,096 | A | 1/1995 | Hirzel |
| 5,404,129 | A | 4/1995 | Novak et al. |
| 5,412,323 | A | 5/1995 | Kato et al. |
| 5,416,402 | A | 5/1995 | Reher et al. |
| 5,428,560 | A | 6/1995 | Leon et al. |
| 5,439,577 | A | 8/1995 | Weres et al. |
| 5,488,283 | A | 1/1996 | Dougherty et al. |
| 5,549,984 | A | 8/1996 | Dougherty |
| 5,552,642 | A | 9/1996 | Dougherty et al. |
| 5,563,496 | A | 10/1996 | McClure |
| 5,572,136 | A | 11/1996 | Champlin |
| 5,578,915 | A | 11/1996 | Crouch, Jr. et al. |
| 5,650,712 | A * | 7/1997 | Kawai et al. ............... 324/427 |
| 5,656,915 | A | 8/1997 | Eaves |
| 5,680,050 | A | 10/1997 | Kawai et al. |
| 5,698,965 | A | 12/1997 | York |
| 5,721,688 | A | 2/1998 | Bramwell |
| 5,744,936 | A | 4/1998 | Kawakami |
| 5,744,963 | A | 4/1998 | Arai et al. |
| 5,761,072 | A | 6/1998 | Bardsley, Jr. et al. |
| 5,773,977 | A | 6/1998 | Dougherty |
| 5,808,367 | A | 9/1998 | Akagi et al. |
| 5,808,445 | A | 9/1998 | Aylor et al. |
| 5,818,116 | A | 10/1998 | Nakae et al. |
| 5,818,333 | A | 10/1998 | Yaffe et al. |
| 5,896,023 | A | 4/1999 | Richter |
| 5,898,292 | A | 4/1999 | Takemoto et al. |
| 5,936,383 | A | 8/1999 | Ng et al. |
| 5,965,954 | A | 10/1999 | Johnson et al. |
| 5,977,654 | A | 11/1999 | Johnson et al. |
| 5,990,660 | A | 11/1999 | Meissner |
| 6,016,047 | A | 1/2000 | Notten et al. |
| 6,037,749 | A | 3/2000 | Parsonage |
| 6,037,777 | A | 3/2000 | Champlin |
| 6,057,666 | A | 5/2000 | Dougherty et al. |
| 6,087,808 | A | 7/2000 | Pritchard |
| 6,091,325 | A | 7/2000 | Zur et al. |
| 6,118,252 | A | 9/2000 | Richter |
| 6,118,275 | A | 9/2000 | Yoon et al. |
| 6,144,185 | A | 11/2000 | Dougherty et al. |
| 6,160,382 | A | 12/2000 | Yoon et al. |
| 6,222,341 | B1 | 4/2001 | Dougherty et al. |
| 6,268,712 | B1 | 7/2001 | Laig-Horstebrock et al. |
| 6,271,642 | B1 | 8/2001 | Dougherty et al. |
| 6,296,593 | B1 | 10/2001 | Gotou et al. |
| 6,300,763 | B1 | 10/2001 | Kwok |
| 6,304,059 | B1 | 10/2001 | Chalasani et al. |
| 6,331,762 | B1 | 12/2001 | Bertness |
| 6,369,578 | B1 | 4/2002 | Crouch, Jr. et al. |
| 6,388,421 | B2 | 5/2002 | Abe |
| 6,388,450 | B2 | 5/2002 | Richter et al. |
| 6,392,389 | B1 | 5/2002 | Kohler |
| 6,392,414 | B2 | 5/2002 | Bertness |
| 6,392,415 | B2 | 5/2002 | Laig-Horstebrock et al. |
| 6,417,668 | B1 | 7/2002 | Howard et al. |
| 6,424,157 | B1 | 7/2002 | Gollomp et al. |
| 6,441,585 | B1 | 8/2002 | Bertness |
| 6,445,158 | B1 | 9/2002 | Bertness et al. |
| 6,452,361 | B2 | 9/2002 | Dougherty et al. |
| 6,472,875 | B1 | 10/2002 | Meyer |
| 6,495,990 | B2 | 12/2002 | Champlin |
| 6,507,194 | B2 | 1/2003 | Suzuki |
| 6,515,452 | B2 | 2/2003 | Choo |
| 6,515,456 | B1 | 2/2003 | Mixon |
| 6,522,148 | B2 | 2/2003 | Ochiai et al. |
| 6,534,992 | B2 | 3/2003 | Meissner et al. |
| 6,556,019 | B2 | 4/2003 | Bertness |
| 6,600,237 | B1 | 7/2003 | Meissner |
| 6,600,293 | B2 | 7/2003 | Kikuchi |
| 6,608,482 | B2 | 8/2003 | Sakai et al. |
| 6,653,818 | B2 | 11/2003 | Laig-Horstebrock et al. |
| 2002/0008495 | A1 | 1/2002 | Dougherty et al. |
| 2002/0026252 | A1 | 2/2002 | Wruck et al. |
| 2002/0031700 | A1 | 3/2002 | Wruck et al. |
| 2003/0047366 | A1 | 3/2003 | Andrews et al. |
| 2003/0082440 | A1 | 5/2003 | Mrotek et al. |
| 2003/0142228 | A1 | 7/2003 | Flach et al. |
| 2003/0236656 | A1 | 12/2003 | Dougherty |
| 2004/0021468 | A1 | 2/2004 | Dougherty et al. |

FOREIGN PATENT DOCUMENTS

| | | |
|---|---|---|
| DE | 2 242 510 C3 | 4/1974 |
| DE | 25 11 426 A1 | 9/1975 |
| DE | 3334128 | 5/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy-to-Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR-003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pp. http://www.cotorelay.com/ReedTech.pdf, available at least by Jan. 6, 2003, 37-43.

Willibert Schleuter, *Das elektrische Ersatzschaltbild des Bleiakkumulators unter Berücksichtigungerzwungener Elektrolytströmung*, etz Archiv, vol. 4 (1982), Issue 7, pp. 213-218.

Lürkens et al., *Ladezustandsschätzuntt von Bleibatterien mit Hilfe des Kalman-Filters*, etz Archiv, vol. 8 (1986), Issue 7, pp. 231-236.

Brooke, L., "Resin Keeps Batteries Cool", A1 Inside Magazine, Nov. 1998, p. 55.

Hoover, J., "Failure Modes of Batteries Removed from Service", A Presentation at the 107th Convention of Battery Council International, Apr. 30-May 3, 1995, p. 62.

Stan Gibilisco and Neil Sclater, Co-Editors-in-Chief, "Rectifier Bridge," Encyclopedia of Electronics, 2nd Edition, TAB Professional and Reference Books, 1996, pp. 708-711.

Lehman, A., "Electrical Battery Model For Leo Application Based on Absolute Instantaneous State of Charge," Proceedings of the European Space Power Conference held in Madrid, Spain, Oct. 2-6, 1989, ESA Publications, NL, vol. 1, pp. 173-178.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Mayer, D. et al., "Modelling and Analysis of Lead Acid Battery Operation," Ecole des Mines de Paris, XP010092137, pp. 1-3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Bosch and the New E-Class, Electronic Battery Management System, Focus on Electronics, Nov. 2002 (1 sheet).

Forecast Review, The Battery Man, Nov. 1996 p. 21.

OnGuard™ XT Battery State-of-Health Monitor, 2003 Midtronics, Inc. P/N 156-983A (2 sheets).

\* cited by examiner

ELECTROCHEMICAL ENERGY STORE AND METHOD FOR DETERMINING THE WEAR TO AN ELECTROCHEMICAL ENERGY STORE

BACKGROUND

The invention relates to a method for determining the wear to an electrochemical energy store resulting from the loss of storage capacity, and to an energy store, in particular a starter battery for motor vehicles, having measurement means for determining the amounts of charge converted during the charging cycles of the energy store, and having computation means.

Energy stores, for example rechargeable electrochemical storage batteries, are subject to wear, in particular during discharging and charging. In addition to discharging and charging, there are also other operating conditions which speed up the wear to electrochemical energy stores. These include, for example, the total operating life in the case of a lead-acid rechargeable battery, that is to say the total time which has passed since it was brought into use, including the periods in which the rechargeable battery had no electrical load applied to it.

Furthermore, increased temperatures can increase the wear during periods without any electrical load being applied, and the wear caused by cyclic discharging and charging.

For the use of energy stores, it is desirable to determine the wear on the basis of the loss of storage capacity. However, the complexity of the processes that take place in the energy store represent a problem in this case, which can be described only with difficulty by using scientific methods.

By way of example, DE 195 40 827 C2 discloses an empirical method for determining the aging state of a battery, in which a battery-specific family of characteristics is predetermined for battery aging. A battery aging value is determined with the aid of the family of characteristics by recording instantaneous values of battery aging influencing variables for the battery that is being monitored.

DE 39 01 680 C3 discloses a method for monitoring the cold starting capability of a starter battery in which, when the internal combustion engine is running, the charging voltage is observed continuously and is monitored to determine whether it has exceeded or fallen below predetermined limit values. This makes it possible to identify a defect in the generator. Furthermore, the time profile of the voltage drop across the connecting terminals of the electrical starter is observed and evaluated during the starting process. However, in this case, it is not possible to make any statement about the available storage capacity of the energy store.

DE 38 08 559 C2 discloses a method for monitoring the power limit of a starter battery, in which an amount of charge balance is produced by adding up the amounts of charge which have flowed in and flowed out. The state of charge of the starter battery is assessed from this, in conjunction with the monitoring of a limiting terminal voltage and the temperature. It is not possible to make any statement about the remaining maximum storage capacity of the energy store in this case, either.

The object of the invention was thus to provide a method for determining the wear to an electrochemical energy store resulting from the loss of storage capacity, by means of which a wear variable can be calculated reliably and using simple means, as a measure of the loss of storage capacity.

SUMMARY OF THE INVENTION

An exemplary embodiment relates to a method for determining the wear to an electrochemical energy store. The method includes continuously determining the amounts of charge ($q_L$) converted during charging cycles of the energy store. The method also includes calculating a wear variable ($Q_v$) which characterizes the wear as a function of the determined converted amount of charge ($q_L$).

Another exemplary embodiment relates to an energy store, in particular a starter battery for motor vehicles. The energy store includes measurement means for determining the amounts of charge ($q_L$) converted during charging cycles of the energy store. The energy store also includes computation means designed to calculate a wear variable ($Q_v$) which characterizes the loss of storage capacity as a function of the determined amount of charge ($q_L$) converted.

BRIEF DESCRIPTION OF THE DRAWINGS

The invention will be explained in more detail in the following text using the attached drawing, in which.

DETAILED DESCRIPTION OF THE PREFERRED AND EXEMPLARY EMBODIMENTS

Figure 1:
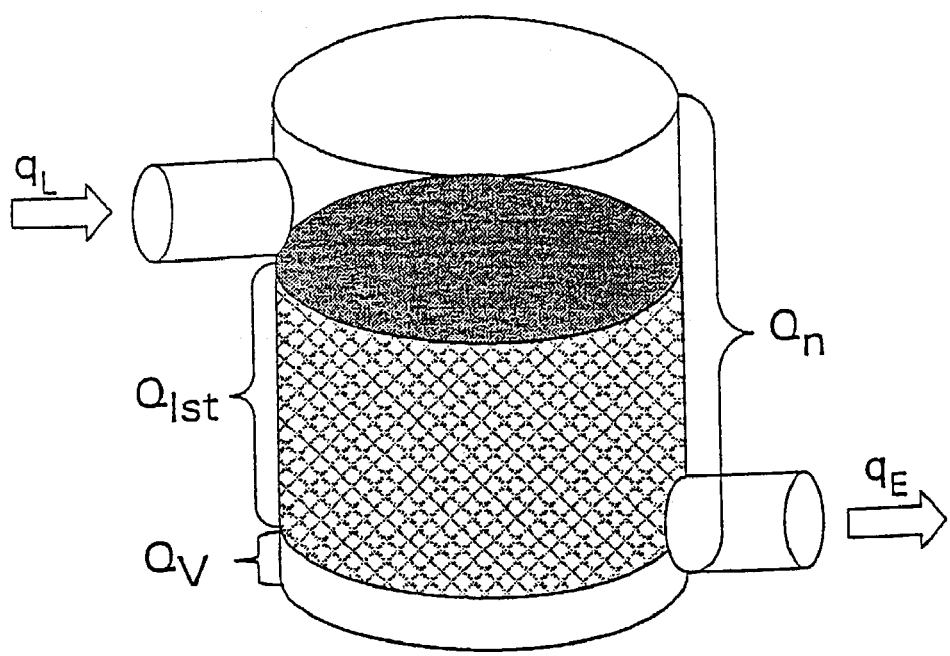
FIG. 1 shows an illustration of a model of an electrochemical energy store.

According to an exemplary embodiment, the present invention provides a method for determining the wear to an electrochemical energy store that utilizes continuous determination of the amounts of charge converted during the charging cycles of the energy store and calculation of a wear variable which characterizes the loss of storage capacity as a function of the determined converted amount of charge.

Surprisingly, it has been found that the wear to an energy store can be determined easily and accurately by considering the amount of charge with which the energy store has been charged. This can be explained by the fact that the charging process governs the structural changes (which cause the wear to the energy store) in the electrochemical active materials and, furthermore, overcharging that affects wear is taken into account. In this case, it was recognized that the loss of storage capacity increases progressively as the amount of charge converted during the charging cycles increases, and that the discharging cycles have no significant influence on this loss.

The amounts of charge converted are preferably determined from the sum of the amounts of charge fed into the energy store, for example by continuous integration of the charging current which flows into the energy store, or by recording changes in the state of charge of the energy store.

It was also recognized that very small charge flows in the charging or discharging direction, which alternate, contribute only a small amount or nothing to the wear to the energy store. The amounts of charge converted, and which are included in the calculation of the wear variable, should thus be greater than a defined minimum amount of charge per charging cycle. Small contributions to the charge flow are thus ignored when determining the wear. The minimum amount of charge is preferably in the range from 0.1 to $1\times10^{-6}$ times, and particularly preferably in the range from 0.01 to 0.001 times, the initial capacity of an equivalent new energy store.

By way of example, the wear variable may be determined in proportion to a wear function which comprises the sum of at least the terms $a_0$, $a_1 \times q^k$ and $a_2 \times q^l$, ($f(q)=a_0+a_1 \times q^k+a_2 \times q^l$). The parameters $a_0$, $a_1$ and $a_2$ are in this case constant. The variable q denotes the amounts of charge converted, the parameter k has values of less than or equal to unity, and the parameter l has values of greater than unity.

It is particularly advantageous for the wear function to be developed into a power series at a development point $q_0$, which comprises a sum of at least the terms $a_1 \times (q-q_0)^k$ and $a_2 \times (q-q_0)^l$ and a constant $a_0$. The parameters $a_1$ and $a_2$ are constant. The variable q once again denotes the amount of charge converted, and the parameter k has values of less than or equal to unity, and the parameter l has values of greater than unity.

The wear function can also be developed into a Taylor series at the development point $q_0$, which comprises a sum of at least the constant value $f(q_0)$ of the wear function at the development point $q_0$ and at least the terms $f'(q_0) \times (q-q_0)$ and $(f''(q_0)/2) \times (q-q_0)^2$. The constant $f'(q_0)$ is the first derivative of the wear function at the development point $q_0$, and $f''(q_0)$ is the second derivative.

The wear variable is preferably determined in 15 proportion to the initial capacity of an equivalent new energy store, for example from the product of the wear function and the initial capacity. However, it may also be proportional to the capacity of an identical energy store at a different operating time.

By way of example, a wear function $f(q)=0.0013 \times q^l + 4 \times 10^{-5} \times q_L^2$ has been found to be suitable for determining the wear for a lead-acid starter rechargeable battery, with the amount of charge $q_L$ being measured in units of the rated capacity of the lead-acid starter rechargeable battery.

It is particularly advantageous to determine a characteristic value for the present storage capacity of the energy store from the difference between the initial capacity of an equivalent new energy store and the wear variable. This characteristic value can be indicated for the present storage capacity, can be used for further calculations, or can be used as a control parameter.

In one development of the method according to the invention, the wear variable may also be linked to further state variables which describe the state of the energy store and are determined using conventional methods. State variables such as these may, for example, be the total operating life of the energy store, the temperature influences, the state of charge, the readiness to produce power, etc.

Another exemplary embodiment relates to an energy store of this generic type by means of computation means which are designed to calculate a wear variable which characterizes the loss of storage capacity as a function of the determined amount of charge converted, using the method described above.

Rechargeable electrochemical energy stores are generally used in two different operating modes.

During pure charging/discharging, charging and discharging phases which are limited in time with respect to one another alternate. The charging phase is in this case generally continued until a defined state, preferably the fully charged state, is reached. This is often followed at a later time by a discharging phase, whose end is defined either by the end of the energy requirement or by exhaustion of the energy store.

When charging and discharging phases alternate, the phase lengths and the amounts of charge converted in the process may differ widely. Normally, the energy store never reaches either the fully charged state or the exhausted state.

Pure charging/discharging is typical, for example, for electrical vehicles such as fork-lift trucks, for flashlights and for portable electronic appliances such as laptops, mobile telephones and camcorders etc. Alternating operation occurs, in contrast, for the vehicle power supply system battery in motor vehicles or generally in so-called island modes, such as those which occur in other vehicles, such as ships, trains, aircraft and space vehicles, or in local power supply networks with battery backup which are supplied, for example, by fuel, solar power or wind power.

During pure charging/discharging, generally relatively large charge flows with respect to the storage capacity of the energy store follow one another alternately in the charging and discharging directions. During alternating operation, on the other hand, very small charge flows often occur in the charging or discharging direction before the mathematical sign of the current flowing through the energy store is reversed once again.

FIG. 1 shows a sketch of an energy store in which an amount of charge $q_L$ is fed in the charging cycle, and a discharge amount $q_E$ is drawn in a discharging cycle. When in a new state, the energy store has an initial capacity $Q_n$ for charge storage. During its life, the available storage capacity $Q_{act}$ decreases owing to wear. The wear variable $Q_v$ characterizes the loss of available storage capacity $Q_{act}$.

It has now been found that the wear in the form of the loss of available storage capacity $Q_{act}$ continues as the amount of charge converted during charging increases, with the wear taking place progressively. The flow of the same amount of charge thus on the one hand leads to greater wear the greater the amount of charge which has already flowed through the energy store in total.

It has also been found that very small charge flows in the charging or discharging direction, which alternate, have scarcely any influence on the wear of the energy store. This is primarily due to the fact that very small charge flows lead only partially, or not at all, to electrochemical reactions in the electrochemical energy store and, instead, are borne at least partially by other processes, such as charge reversal of the Helmholtz double layer between a solid body and the electrolyte. The amount of charge $q_L$, which is converted and is taken into account in order to determine the wear thus includes only those amounts of charge $q_L$ which, within a charging cycle, exceed a minimum amount of charge $q_{min}$ in the range from 0.1 to $1 \times 10^{-6}$ times the initial capacity $Q_n$ of an equivalent new energy store. The amount of charge $q_L$, converted should preferably exceed a minimum amount of charge $q_{min}$ in the range from 0.01 to 0.001 times the initial capacity $Q_n$.

The amount of charge converted during one charging cycle is determined, for example, by integration of the measured, calculated or estimated current. Alternatively, the amount of charge $q_L$ converted can be determined by measurement, calculation or estimation of a change in the state of charge which, for example, may be derived from a measurement of the no-load voltage, or from some other voltage.

The wear variable $Q_v$ is then determined as a function $f(q_L)$ of the determined amount of charge $q_L$ converted.

The function may consist, for example, of the sum of at least the terms $a_0$, $a_1 \times q^k$ and $q_2 \times q^l$:

$$f(q)=a_0+a_1 \times q^k+a_2 \times q^l.$$

In this case, $a_0$, $a_1$ and $a_2$ are constant parameters. The parameter k is defined such that it assumes values of less than or equal to unity, and the parameter l is greater than unity.

In one particular refinement of the method, the wear function is defined as:

$$f(q_L) = a_1 \times q_L + a_2 \times q_L^2.$$

The coefficients $a_1 = 0.0013$ and $a_2 = 4 \times 10^{-5}$ have been found to be optimum values for a lead-acid starter rechargeable battery.

The wear function f(q) can also be developed into a power series at the development point $q_0$, and consists at least of the following sum:

$$f(q) = a_0 + a_1 \times (q - q_0)^k + a_2 \times (q - q_0)^l.$$

In this case, $a_0$, $a_1$ and $a_2$ are once again constant parameters, and the parameters k are defined for values of less than or equal to unity, and l for values of greater than unity.

The wear function f(q) may also be developed into a Taylor series at the development point $q_0$, which has at least the following sum:

$$f(q) = f'(q_0) \times (q - q_0) + (f''(q_0)/2) \times (q - q_0)^2.$$

The wear variable $Q_v$ is then preferably calculated from the product of the wear function $f(q_L)$ and the initial capacity $Q_n$.

The storage capacity $Q_{act}$ available at any given time is calculated from the difference between the initial capacity $Q_n$ and the wear variable $Q_v$:

$$Q_{act} = Q_n - Q_v = Q_n (1 - f(q_L)).$$

Priority application DE 102 15 071.0 filed on Apr. 5, 2002, including the specification, drawing, claims, and abstract, is incorporated herein by reference in its entirety.

It is important to note that the construction and arrangement of the elements of the energy store as shown and described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. It should be noted that the elements and/or assemblies of the system may be constructed from any of a wide variety of materials that provide sufficient strength or durability. Other substitutions, modifications, changes and omissions may be made in the design, operating conditions and arrangement of the preferred and other exemplary embodiments without departing from the scope of the present invention.

What is claimed is:

1. A method for determining the wear to an electrochemical energy store, comprising:
   continuously determining the amounts of charge (qL) converted during charging cycles of the energy store; and
   calculating a wear variable (Qv) which characterizes the wear as a function of the determined converted amount of charge (qL);
   wherein the determined converted amount of charge ($q_L$) is greater than a defined minimum amount of charge ($q_{min}$) per charging cycle; and
   wherein the minimum amount of charge ($q_{min}$) is in the range from 0.1 to $1 \times 10^{-6}$ times an initial capacity ($Q_n$) of an equivalent new energy store.

2. The method of claim 1 wherein determining the converted amount of charge ($q_L$) utilizes a sum of the amounts of charge fed into the energy store.

3. The method of claim 1 wherein determining the amount of charge ($q_L$) converted includes continuously integrating charging current (IL) which flows into the energy store.

4. The method of claim 1 wherein determining the amounts of charge ($q_L$) converted includes detecting state of charge changes in the energy store.

5. The method of claim 1 wherein the amounts of charge ($q_L$) are greater than a defined minimum amount of charge ($q_{min}$) per charging cycle.

6. The method of claim 1 wherein the minimum amount of charge ($q_{min}$) is in the range from 0.01 to 0.001 times the initial capacity ($Q_n$) of the equivalent new energy store.

7. The method of claim 1 wherein the wear variable ($Q_v$) is proportional to a wear function (f(q)), the wear function (f(q)) comprising the sum of at least the terms $a_0$, $a_1 \times q^k$ and $a_2 \times q^l$, where $a_0$, $a_1$ and $a_2$ are constant parameters, q is the amount of charge converted and the parameter k is less than or equal to unity, and the parameter l is greater than unity.

8. The method of claim 1 wherein the wear variable ($Q_v$) is proportional to a wear function (f(q)), the wear function (f(q)) being developed as a power series at a development point ($q_0$) and comprising a sum of at least the terms $a_1 \times (q - q_0)^k$ and $a_2 \times (q - q_0)^l$ and a constant $a_0$, where $a_1$ and $a_2$ are constant parameters, q is the amount of charge converted, and the parameter k is less than or equal to unity, and the parameter l is greater than unity.

9. The method of claim 1 wherein the wear variable ($Q_v$) is developed proportionally to a wear function (f(q)) into a Taylor series at a development point ($q_0$) comprising a sum of a constant value (f($q_0$)) of the wear function (f(q)) at the development point ($q_0$) and at least the terms $f'(q_0) \times (q - q_0)$ and $(f''(q_0)/2) \times (q - q_0)^2$, where $f'(q_0)$ is the first derivative of the wear function (f(q)) at the development point ($q_0$) and $f''(q_0)$ is the second derivative of the wear function (f(q)) at the development point ($q_0$).

10. The method of claim 1 wherein the wear variable ($Q_v$) is proportional to an initial capacity ($Q_n$) of an equivalent new energy store.

11. The method of claim 1 wherein calculating the wear variable ($Q_v$) utilizes the product of a wear function (f(q)) and an initial capacity ($Q_n$) of an equivalent new energy store.

12. The method of claim 1 further comprising determining a characteristic value for a present storage capacity ($Q_{act}$) of the energy store from the difference between an initial capacity ($Q_n$) of an equivalent new energy store and the wear variable ($Q_v$).

13. The method of claim 1 wherein the wear variable ($Q_v$) is linked to further state variables which describe the state of the energy store.

* * * * *